(12) United States Patent
Yang

(10) Patent No.: US 12,471,257 B2
(45) Date of Patent: Nov. 11, 2025

(54) JET IMPINGEMENT COOLING APPARATUS

(71) Applicants: HYUNDAI MOTOR COMPANY, Seoul (KR); KIA CORPORATION, Seoul (KR)

(72) Inventor: Il Suk Yang, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 235 days.

(21) Appl. No.: 18/207,908

(22) Filed: Jun. 9, 2023

(65) Prior Publication Data

US 2024/0188258 A1 Jun. 6, 2024

(30) Foreign Application Priority Data

Dec. 5, 2022 (KR) .......................... 10-2022-0167964

(51) Int. Cl.
*H05K 7/20* (2006.01)

(52) U.S. Cl.
CPC ..... *H05K 7/20909* (2013.01); *H05K 7/20145* (2013.01)

(58) Field of Classification Search
CPC .................. H05K 7/20145; H05K 7/20909
See application file for complete search history.

(56) References Cited

U.S. PATENT DOCUMENTS

| | | | | |
|---|---|---|---|---|
| 6,431,260 | B1 * | 8/2002 | Agonafer | H01L 23/4735 257/714 |
| 6,519,151 | B2 * | 2/2003 | Chu | H01L 23/4735 165/80.4 |
| 7,511,957 | B2 * | 3/2009 | Campbell | H01L 23/4735 257/714 |
| 10,798,851 | B1 * | 10/2020 | Weber | H05K 7/20327 |
| 2021/0066164 | A1 * | 3/2021 | Wu | H01L 23/147 |
| 2021/0111100 | A1 * | 4/2021 | Galloway | H01L 23/4735 |

* cited by examiner

*Primary Examiner* — Mukundbhai G Patel
(74) *Attorney, Agent, or Firm* — MCDONNELL BOEHNEN HULBERT & BERGHOFF LLP

(57) ABSTRACT

A jet impingement cooling apparatus includes a target having a flat surface and a plurality of recesses recessed from the flat surface, and a jet member having a plurality of orifices aligned with the plurality of recesses, respectively, wherein a cooling fluid is ejected from each orifice to the plurality of recesses.

8 Claims, 10 Drawing Sheets

JET IMPINGEMENT COOLING APPARATUS

CROSS REFERENCE TO RELATED APPLICATIONS

This application is based on and claims the benefit of priority to Korean Patent Application No. 10-2022-0167964, filed on Dec. 5, 2022, in the Korean Intellectual Property Office, the disclosure of which is incorporated herein in its entirety by reference.

TECHNICAL FIELD

The present disclosure relates to a jet impingement cooling apparatus, and more particularly, to a jet impingement cooling apparatus significantly improving cooling of a power module.

BACKGROUND

A power module used in an electronic device such as an inverter generates heat while operating. If the heat generated by the power module is not removed, cracks may occur in at least some components of the power module or delamination may occur between the components of the power module, and as a result, the power module may fail to operate. Thus, when a temperature of the power module increases above a threshold temperature, the operation of the power module may be restricted or stopped.

In recent years, as power output of an electric vehicle increases, high power output of an inverter of the electric vehicle is required. Accordingly, the power module used in the inverter may be cooled by a cooling apparatus using a cooling fluid.

A cooling apparatus according to the related art includes a cooling channel parallel to the power module. As the cooling fluid flows through the cooling channel, the cooling fluid cools the power module. In addition, a plurality of cooling fins may be provided to the cooling channel so that cooling of the power module may be improved.

In addition, another cooling apparatus according to the related art includes a microchannel. As the cooling fluid flows through the microchannel, the cooling of the power module may be improved.

In the related art cooling apparatus, however, as the cooling fluid flows in a direction parallel to the power module, the flow rate of the cooling fluid may be limited, and a severe temperature difference may occur between an inlet and an outlet of the cooling channel. Thus, the cooling of the power module may be reduced.

The above information described in this background section is provided to assist in understanding the background of the inventive concept, and may include any technical concept which is not considered as the prior art that is already known to those skilled in the art.

SUMMARY

The present disclosure has been made to solve the above-mentioned problems occurring in the prior art while advantages achieved by the prior art are maintained intact.

An aspect of the present disclosure provides a jet impingement cooling apparatus significantly improving cooling of a power module.

According to an aspect of the present disclosure, a jet impingement cooling apparatus may include a target having a flat surface and a plurality of recesses recessed from the flat surface, and a jet member having a plurality of orifices aligned with the plurality of recesses, respectively. A cooling fluid may be ejected from each orifice to the plurality of recesses.

Each recess may have a hemispherical shape.

A central axis of each orifice may be aligned with a central axis of a corresponding recess.

The target may be a support member contacting a power module, and the support member may include a first surface facing the jet member and a second surface directly contacting the power module. The plurality of recesses may be recessed from the first surface of the support member.

The target may be a power module, the power module may be supported by a support member, the support member may have an opening which is open to the power module and the jet member, the plurality of recesses may be recessed from a flat surface of the power module, and the plurality of recesses may be exposed to the opening.

A diameter of each recess may be greater than a diameter of the orifice.

According to another aspect of the present disclosure, a jet impingement cooling apparatus may include a plurality of power modules, a support member contacting the plurality of power modules, a plurality of jet members mounted on the support member, and a plurality of manifolds mounted on the plurality of jet members, respectively. Each jet member may have a plurality of orifices spaced apart from the support member, and each manifold and a corresponding jet member may define a distribution chamber in which a cooling fluid is received.

The support member may have a plurality of recesses aligned with the plurality of orifices, respectively.

The support member may have a plurality of openings which are open to the plurality of power modules, respectively, and each power module may have a plurality of recesses which are aligned with the plurality of orifices, respectively.

The jet impingement cooling apparatus may further include an inlet channel fluidly connected to the plurality of manifolds, and having an inlet chamber defined therein, and an outlet channel fluidly connected to the plurality of jet members, and an outlet chamber defined therein.

The plurality of manifolds may be connected in parallel to the inlet chamber of the inlet channel, and the plurality of jet members may be connected in parallel to the outlet chamber of the outlet channel.

The jet impingement cooling apparatus may further include a plurality of drain pipes communicating with the plurality of jet members, respectively. The plurality of drain pipes may be connected in parallel to the outlet chamber of the outlet channel.

Each jet member may have a collecting space in which the cooling fluid is collected, and each drain pipe may fluidly connect the collecting space of the corresponding jet member and the outlet chamber of the outlet channel.

BRIEF DESCRIPTION OF THE FIGURES

The above and other objects, features and advantages of the present disclosure will be more apparent from the following detailed description taken in conjunction with the accompanying drawings.

DETAILED DESCRIPTION

Figure 1:
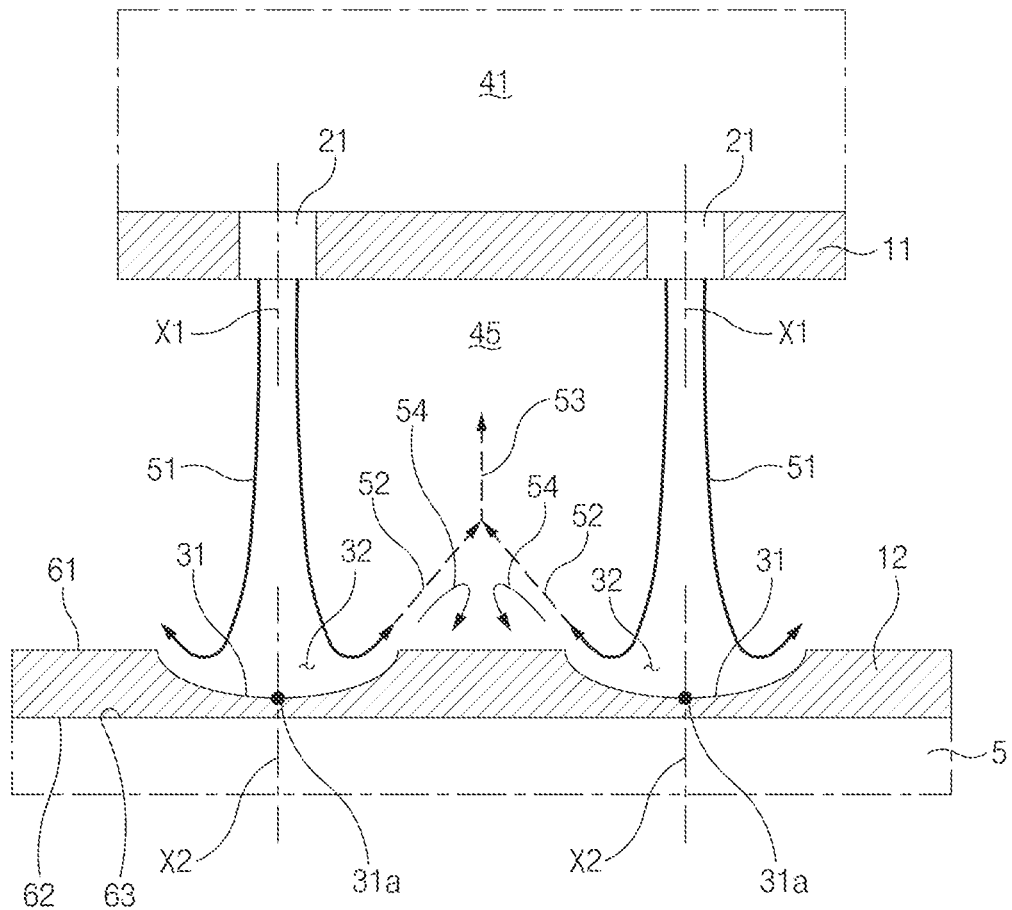
FIG. 1 illustrates a jet impingement cooling apparatus according to an exemplary embodiment of the present disclosure.

Hereinafter, exemplary embodiments of the present disclosure will be described in detail with reference to the accompanying drawings. In the drawings, the same reference numerals will be used throughout to designate the same or equivalent elements. In addition, a detailed description of well-known techniques associated with the present disclosure will be ruled out in order not to unnecessarily obscure the gist of the present disclosure.

Terms such as first, second, A, B, (a), and (b) may be used to describe the elements in exemplary embodiments of the present disclosure. These terms are only used to distinguish one element from another element, and the intrinsic features, sequence or order, and the like of the corresponding elements are not limited by the terms. Unless otherwise defined, all terms used herein, including technical or scientific terms, have the same meanings as those generally understood by those with ordinary knowledge in the field of art to which the present disclosure belongs. Such terms as those defined in a generally used dictionary are to be interpreted as having meanings equal to the contextual meanings in the relevant field of art, and are not to be interpreted as having ideal or excessively formal meanings unless clearly defined as having such in the present application.

Referring to FIG. 1, a jet impingement cooling apparatus according to an exemplary embodiment of the present disclosure may include a jet member 11 having a plurality of orifices 21, and a support member 12 spaced apart from the jet member 11.

Referring to FIG. 1, the plurality of orifices 21 may be spaced apart from each other by a predetermined gap, and a distribution chamber 41 in which a cooling fluid is received may be located on the jet member 11. The cooling fluid may be ejected from the distribution chamber 41 through the plurality of orifices 21 so that a plurality of jet streams 51 may directly strike the support member 12. According to the exemplary embodiment illustrated in FIG. 1, the support member 12 may be a target on which the plurality of jet streams individually ejected from the plurality of orifices 21 directly impinge.

The support member 12 may be spaced apart from the jet member 11 so that a space 45 may be formed between the support member 12 and the jet member 11. The support member 12 may support a power module 5 to be cooled. In particular, at least a portion of the support member 12 may directly contact at least a portion of the power module 5 so that heat may be transferred between the support member 12 and the power module 5, and thus the power module 5 may be indirectly cooled through the support member 12. For example, the power module 5 may be used in an electronic device such as an inverter.

The support member 12 may include a first surface 61 facing the jet member 11, a second surface 62 directly contacting the power module 5, and a plurality of recesses 31 recessed from the first surface 61. The first surface 61 and the second surface 62 may be flat. Each recess 31 may be recessed from the first surface 61, and each recess 31 may have a cavity 32 defined therein.

According to an exemplary embodiment, each recess 31 may have a hemispherical shape, and a central point 31a of the recess 31 may be located at the bottom.

The plurality of orifices 21 may be aligned with the plurality of recesses 31, respectively. Specifically, a central axis X1 of each orifice 21 may be aligned with a central axis X2 of the corresponding recess 31. The plurality of jet streams 51 ejected from the plurality of orifices 21 may directly strike the plurality of recesses 31. As the cooling fluid flows along a surface of the recess 31 from the central point 31a of the recess 31 in an impingement region, a wall jet 52 may be formed around each recess 31. In particular, as the cooling fluid flows along the hemispherical surface of the recess 31 from the impingement region, the wall jet 52 may flow at a predetermined angle inclined with respect to the first surface 61. Accordingly, the adjacent wall jets 52 may be merged so that a merged stream 53 of relatively high velocity may flow toward the jet member 11. Since an additional stagnation region is not formed between the adjacent wall jets 52, heat transfer efficiency between the cooling fluid and the support member 12 may be improved. In particular, a vortex 54 may be formed within the adjacent wall jets 52, and the heat transfer efficiency between the cooling fluid and the support member 12 may be further improved by the vortex 54, and thus cooling of the support member 12 may increase.

According to the exemplary embodiment illustrated in FIG. 1, the power module 5 may have a flat surface 63 contacting the second surface 62 of the support member 12. As the support member 12 is cooled by the jet impingement of the cooling fluid, the power module 5 may be indirectly cooled through the support member 12.

Figure 2:
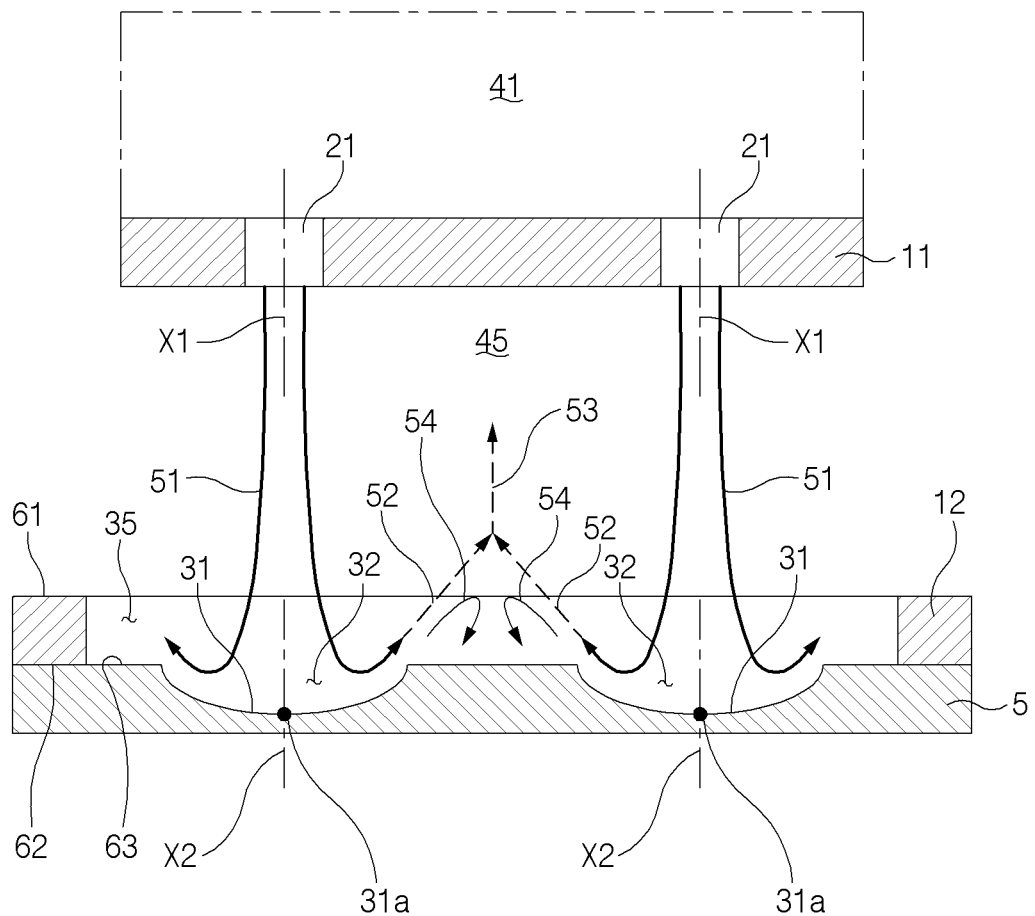
FIG. 2 illustrates a jet impingement cooling apparatus according to another exemplary embodiment of the present disclosure.

FIG. 2 illustrates a jet impingement cooling apparatus according to another exemplary embodiment of the present disclosure. Referring to FIG. 2, the support member 12 may have an opening 35 open to the jet member 11 and the power module 5, and a cooling fluid may be ejected from the plurality of orifices 21 so that the cooling fluid may directly strike the power module 5 through the opening 35. According to the exemplary embodiment illustrated in FIG. 2, the power module 5 may be a target on which the plurality of jet streams 51 individually ejected from the plurality of orifices 21 directly impinge, and the cooling fluid may directly cool the power module 5. A portion of the flat surface 63 of the power module 5 may be exposed to the opening 35 of the support member 12, and the plurality of recesses 31 may be recessed from the portion of the flat surface 63 of the power module 5 exposed to the opening 35. Accordingly, the plurality of recesses 31 may be exposed through the opening 35 of the support member 12, and the central axis X2 of each recess 31 may be aligned with the central axis X1 of the corresponding orifice 21. The other elements in this exemplary embodiment may be the same as or similar to those in the exemplary embodiment illustrated in FIG. 1, and thus a detailed description thereof will be omitted.

Referring to FIGS. 1 and 2, an outer diameter of the orifice 21 may be less than an outer diameter of the recess 31, and accordingly the velocity of the jet stream 51 ejected from the orifice 21 may be relatively increased.

Figure 3:
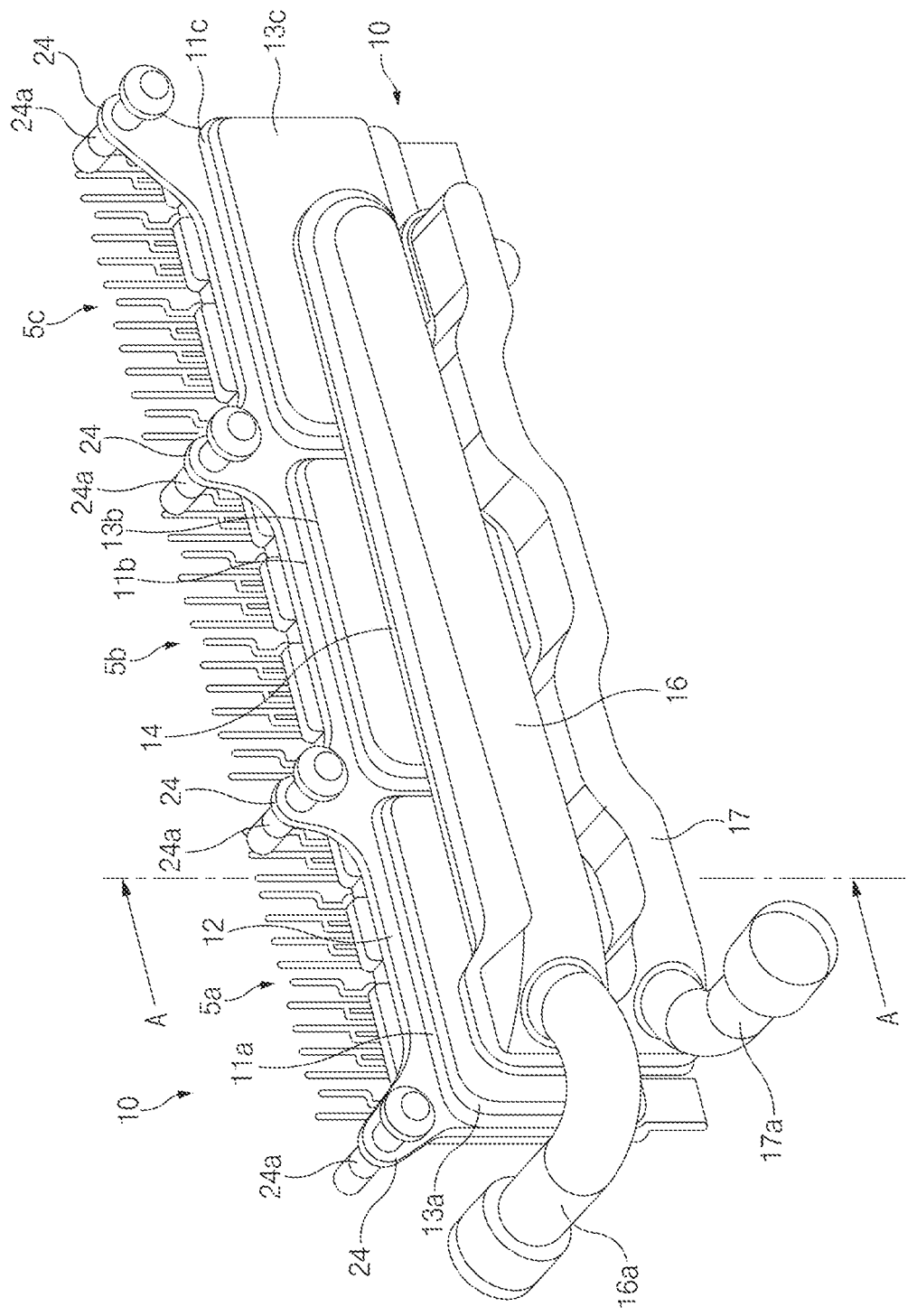
FIG. 3 illustrates a perspective view of a jet impingement cooling apparatus according to an exemplary embodiment of the present disclosure.

FIG. 3 illustrates a perspective view of a jet impingement cooling apparatus 10 according to an exemplary embodiment of the present disclosure. Referring to FIG. 3, an electronic device such as an inverter may include a plurality of power modules 5a, 5b, and 5c, and a support member 12 supporting the plurality of power modules 5a, 5b, and 5c. The plurality of power modules 5a, 5b, and 5c may contact the support member 12 so that the plurality of power modules 5a, 5b, and 5c may be supported by the support member 12. The support member 12 may include a plurality of mounting lugs 24, and each mounting lug 24 may have a through hole through which a fastener 24a is received. The support member 12 may be mounted on a housing of the electronic device through the plurality of fasteners 24a.

Referring to FIG. 3, the jet impingement cooling apparatus 10 according to an exemplary embodiment of the present disclosure may include the plurality of power modules 5a, 5b, and 5c supported by the support member 12, and a plurality of jet members 11a, 11b, and 11c mounted on the support member 12.

Figure 4:
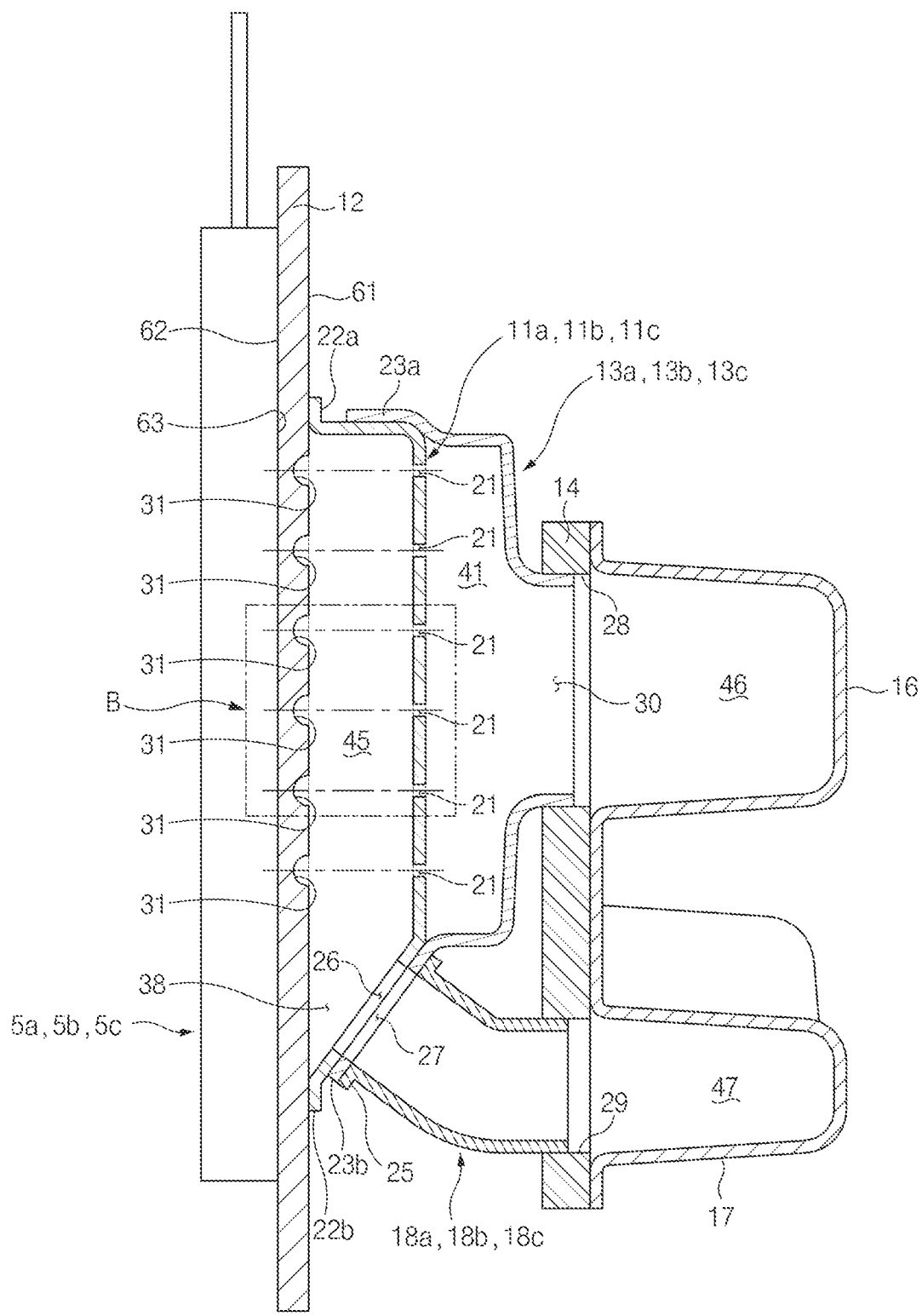
FIG. 4 illustrates a cross-sectional view, taken along line A-A of FIG. 3.

Referring to FIG. 4, the support member 12 may be a flat plate, and the plurality of jet members 11a, 11b, and 11c may be spaced apart from the first surface 61 of the support member 12 by a predetermined gap. The plurality of power modules 5a, 5b, and 5c may contact the second surface 62 of the support member 12 so that the plurality of power modules 5a, 5b, and 5c may be supported by the support member 12. That is, the support member 12 may be located between the plurality of power modules 5a, 5b, and 5c and the plurality of jet members 11a, 11b, and 11c.

Figure 5:
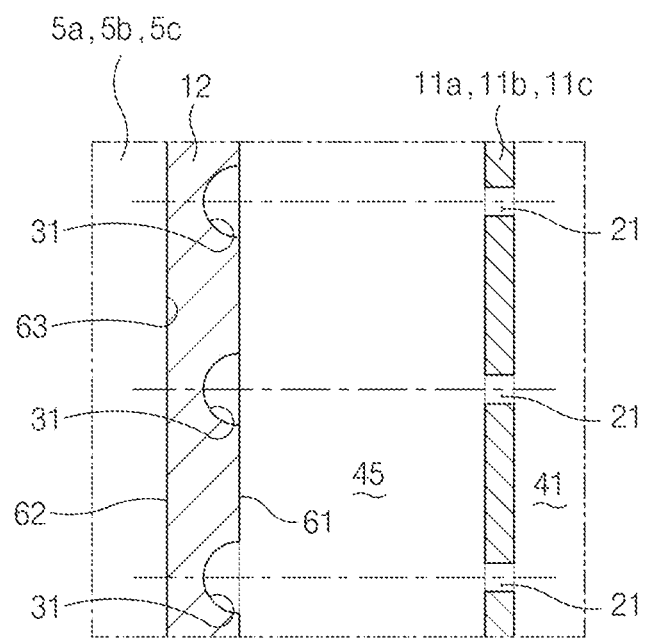
FIG. 5 illustrates an enlarged view of portion B of FIG. 4.

Referring to FIGS. 4 and 5, the plurality of recesses 31 may be recessed from the first surface 61 of the support member 12, and each of the jet members 11a, 11b, and 11c may have the plurality of orifices 21 aligned with the plurality of recesses 31, respectively.

The plurality of jet members 11a, 11b, and 11c may correspond to the plurality of power modules 5a, 5b, and 5c, respectively. For example, a first jet member 11a may be located opposite to a first power module 5a, a second jet member 11b may be located opposite to a second power module 5b, and a third jet member 11c may be located opposite to a third power module 5c.

According to the exemplary embodiment illustrated in FIG. 4, each of the jet members 11a, 11b, and 11c may have a channel-shaped cross-section which is open to the first surface 61 of the support member 12. Accordingly, a space 45 may be formed between each of the jet members 11a, 11b, and 11c and the first surface 61 of the support member 12. Each of the jet members 11a, 11b, and 11c may have a plurality of flanges 22a and 22b provided on edges of top and bottom walls thereof, respectively. The flanges 22a and 22b may be attached to the first surface 61 of the support member 12 by brazing and/or the like so that each of the jet members 11a, 11b, and 11c may be joined to the first surface 61 of the support member 12 in a sealed manner.

According to another exemplary embodiment, the support member 12 may have flanges protruding toward the jet members 11a, 11b, and 11c, and each of the jet members 11a, 11b, and 11c may be a flat plate. Edges of each of the jet members 11a, 11b, and 11c and the flanges of the support member 12 may be joined to have gaps between the orifices 21 and the recesses 31.

Referring to FIGS. 3 and 4, the jet impingement cooling apparatus 10 according to an exemplary embodiment of the present disclosure may include a plurality of manifolds 13a, 13b, and 13c mounted on the plurality of jet members 11a, 11b, and 11c, respectively. For example, a first manifold 13a may be mounted on the first jet member 11a, a second manifold 13b may be mounted on the second jet member 11b, and a third manifold 13c may be mounted on the third jet member 11c.

Referring to FIG. 4, each of the manifolds 13a, 13b, and 13c may have a channel-shaped cross-section which is open to the corresponding one of the jet members 11a, 11b, and 11c, and each of the manifolds 13a, 13b, and 13c may have a plurality of flanges 23a and 23b provided on edges of top and bottom walls thereof, respectively. The plurality of flanges 23a and 23b may be attached to the corresponding one of the jet members 11a, 11b, and 11c by brazing and/or the like so that each of the manifolds 13a, 13b, and 13c may be joined to the corresponding one of the jet members 11a, 11b, and 11c in a sealed manner. Each of the manifolds 13a, 13b, and 13c and the corresponding one of the jet members 11a, 11b, and 11c may define the distribution chamber 41, and the cooling fluid received in the distribution chamber 41 may be uniformly distributed to the plurality of orifices 21.

Referring to FIG. 4, each of the jet members 11a, 11b, and 11c may have a collecting space 38 in which the cooling fluid is collected after striking the support member 12, and the collecting space 38 may be defined between a lower portion of each of the jet members 11a, 11b, and 11c and the support member 12. Each of the jet members 11a, 11b, and 11c may have a drain hole 26 communicating with the collecting space 38, and each of the manifolds 13a, 13b, and 13c may have a communicating hole 27 aligned with the drain hole 26 of the corresponding one of the jet members 11a, 11b, and 11c.

Referring to FIG. 3, the jet impingement cooling apparatus 10 according to an exemplary embodiment of the present disclosure may further include an inlet channel 16 fluidly connected to the plurality of manifolds 13a, 13b, and 13c, and an outlet channel 17 fluidly connected to the plurality of jet members 11a, 11b, and 11c. The inlet channel 16 and the outlet channel 17 may form a unitary one-piece structure.

The inlet channel 16 may have a channel-shaped cross-section, and the inlet channel 16 may extend along the length of the support member 12. Referring to FIGS. 3 and 4, the inlet channel 16 may have an inlet chamber 46 defined therein, and an inlet pipe 16a communicating with the inlet chamber 46. The plurality of manifolds 13a, 13b, and 13c may be connected in parallel to the inlet chamber 46 of the inlet channel 16. Each of the manifolds 13a, 13b, and 13c may have an inlet 30 communicating with the inlet chamber 46 of the inlet channel 16. The cooling fluid may be supplied to the inlet chamber 46 of the inlet channel 16 through the inlet pipe 16a, and the cooling fluid received in the inlet chamber 46 may be primarily distributed to the plurality of manifolds 13a, 13b, and 13c so that the distribution chamber 41 of each of the manifolds 13a, 13b, and 13c may receive the cooling fluid. The cooling fluid received in the distribution chamber 41 may be secondarily distributed to the plurality of orifices 21.

According to an exemplary embodiment, the inlet pipe 16a may allow the cooling fluid to flow in a direction perpendicular to the first surface 61 of the support member 12.

According to another exemplary embodiment, the inlet pipe 16a may allow the cooling fluid to flow in a direction parallel to the first surface 61 of the support member 12.

The outlet channel 17 may have a channel-shaped cross-section, and the outlet channel 17 may extend along the length of the support member 12. Referring to FIGS. 3 and 4, the outlet channel 17 may have an outlet chamber 47 defined therein, and an outlet pipe 17a communicating with the outlet chamber 47.

Referring to FIG. 4, the jet impingement cooling apparatus 10 according to an exemplary embodiment of the present disclosure may further include a plurality of drain pipes 18a, 18b, and 18c communicating with the plurality of jet members 11a, 11b, and 11c, respectively. For example, a first drain pipe 18a may communicate with the first jet member 11a, a second drain pipe 18b may communicate with the second jet member 11b, and a third drain pipe 18c may communicate with the third jet member 11c.

The plurality of drain pipes 18a, 18b, and 18c may be connected in parallel to the outlet chamber 47 of the outlet channel 17. Accordingly, each of the drain pipes 18a, 18b, and 18c may be configured to fluidly connect the corresponding one of the jet members 11a, 11b, and 11c and the outlet chamber 47 of the outlet channel 17.

Each of the drain pipes 18a, 18b, and 18c may include a first end portion communicating with the collecting space 38 of the corresponding one of the jet members 11a, 11b, and 11c, and a second end portion communicating with the outlet chamber 47 of the outlet channel 17.

Each of the drain pipes 18a, 18b, and 18c may have a flange 25 provided on the first end portion thereof, and the flange 25 may be attached to the corresponding one of the manifolds 13a, 13b, and 13c by brazing and/or the like so that each of the drain pipes 18a, 18b, and 18c may be fluidly connected to the collecting space 38 of the corresponding one of the jet members 11a, 11b, and 11c through the communicating hole 27 and the drain hole 26.

The cooling fluid may be collected in the collecting space 38 of each of the jet members 11a, 11b, and 11c after ejected from the orifices 21 of each of the jet members 11a, 11b, and 11c and impinging on the recesses 31. The cooling fluid collected in the collecting space 38 may be merged in the outlet chamber 47 of the outlet channel 17 through the corresponding drain pipes 18a, 18b, and 18c, and the cooling fluid merged in the outlet chamber 47 may be discharged through the outlet pipe 17a.

Referring to FIG. 4, the jet impingement cooling apparatus 10 according to an exemplary embodiment of the present disclosure may further include a connection plate 14 fixed to the inlet channel 16 and the outlet channel 17. The connection plate 14 may be configured to connect the inlet channel 16 and the plurality of manifolds 13a, 13b, and 13c. The connection plate 14 may include a plurality of first through holes 28 each receiving the inlet 30 of each of the manifolds 13a, 13b, and 13c, and a plurality of second through holes 29 each receiving the second end portion of each of the drain pipes 18a, 18b, and 18c. The inlet 30 of each of the manifolds 13a, 13b, and 13c may be attached to the corresponding first through hole 28 of the connection plate 14 by brazing and/or the like so that the inlet 30 of each of the manifolds 13a, 13b, and 13c may be connected to the connection plate 14 in a sealed manner. The second end portion of each of the drain pipes 18a, 18b, and 18c may be attached to the corresponding second through hole 29 of the connection plate 14 by brazing and/or the like so that each of the drain pipes 18a, 18b, and 18c may be connected to the connection plate 14 in a sealed manner.

Figure 6:
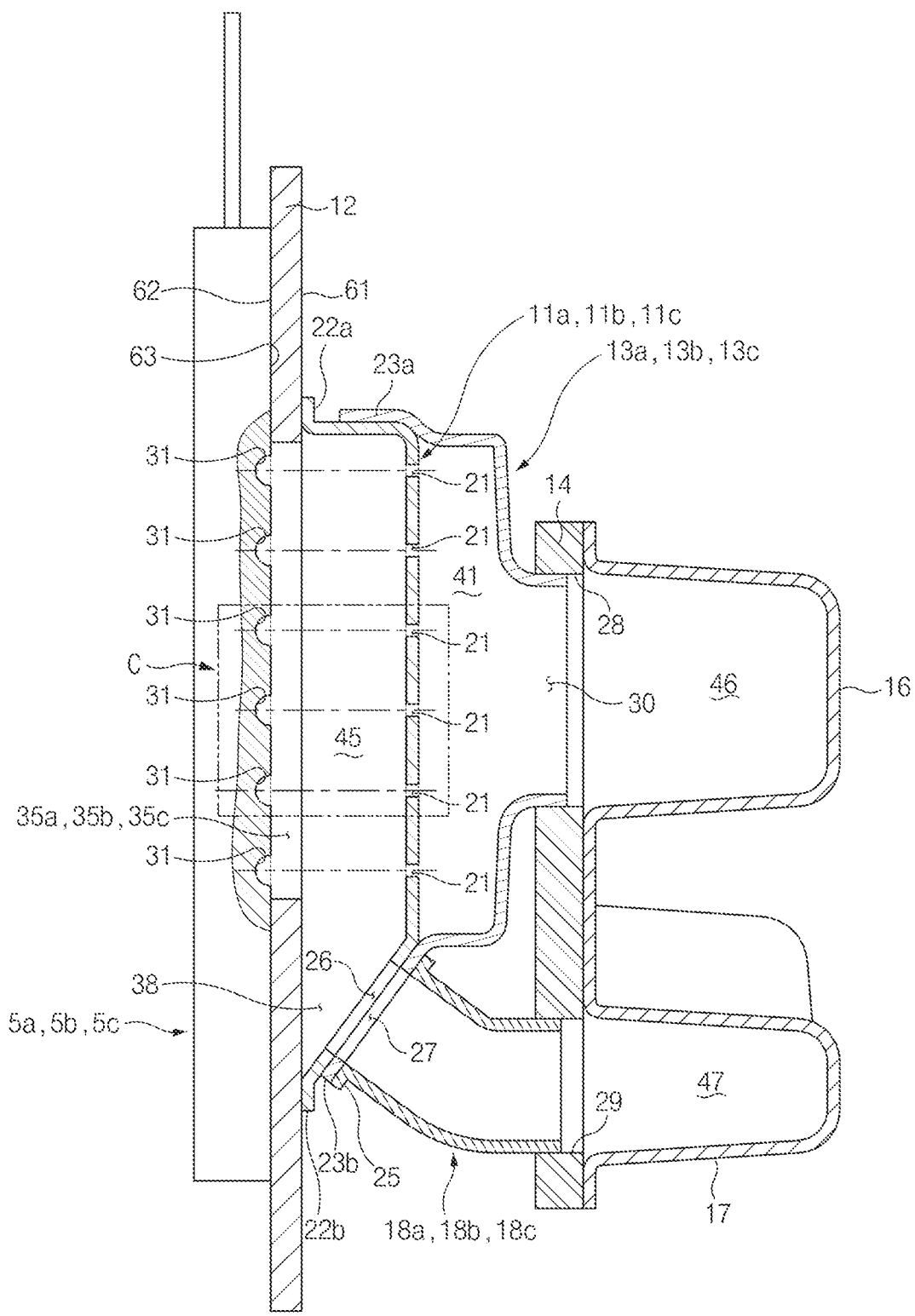
FIG. 6 illustrates a jet impingement cooling apparatus according to another exemplary embodiment of the present disclosure.
Figure 7:
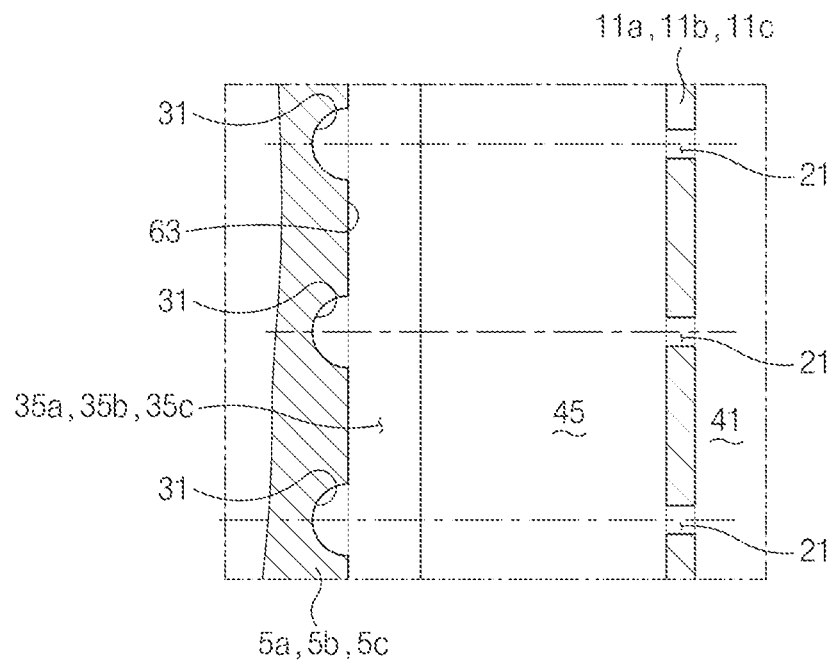
FIG. 7 illustrates an enlarged view of portion C of FIG. 6.

FIGS. 6 and 7 illustrate a jet impingement cooling apparatus according to another exemplary embodiment of the present disclosure. Referring to FIGS. 6 and 7, the support member 12 may include a plurality of openings 35a, 35b, and 35c which are open to the plurality of power modules 5a, 5b, and 5c, respectively. The openings 35a, 35b, and 35c may be open to the corresponding power modules 5a, 5b, and 5c and the corresponding jet members 11a, 11b, and 11c, respectively. Referring to FIGS. 6 and 7, the plurality of recesses 31 may be recessed from the flat surface 63 of each of the power modules 5a, 5b, and 5c, and each of the jet members 11a, 11b, and 11c may have the plurality of orifices 21 aligned with the plurality of recesses 31, respectively. The other elements in this exemplary embodiment may be the same as or similar to those in the exemplary embodiment illustrated in FIGS. 4 and 5, and thus a detailed description thereof will be omitted.

The jet impingement cooling apparatus 10 according to an exemplary embodiment of the present disclosure may be fluidly connected to a power electronic cooling system 100.

Figure 8:
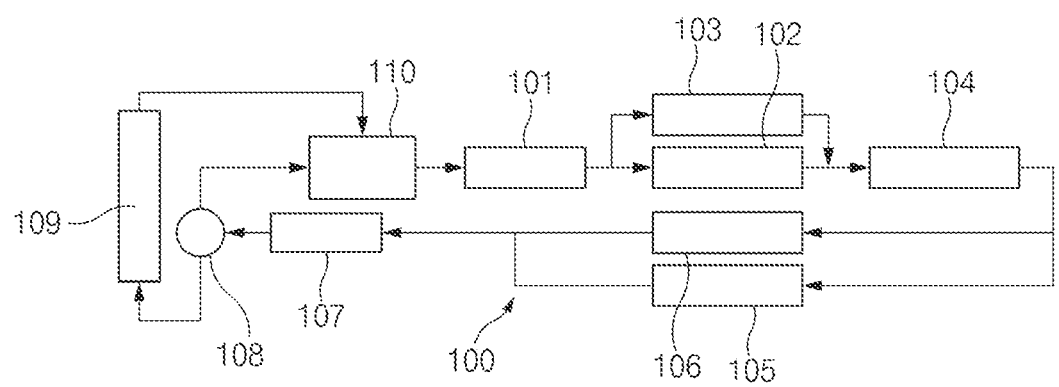
FIG. 8 illustrates a power electronic cooling system.

FIG. 8 illustrates a power electronic cooling system. Referring to FIG. 8, the power electronic cooling system 100 may be configured to cool a plurality of power electronic components 102, 103, 104, 105, 106, and 107 using a cooling fluid. The power electronic cooling system 100 may include a pump 101 allowing the cooling fluid to circulate.

Referring to FIG. 8, the plurality of power electronic components 102, 103, 104, 105, 106, and 107 may include a front wheel inverter 102 located on the downstream of the pump 101, an oil cooler 103 of a front wheel motor connected in parallel to the front wheel inverter 102, a high-voltage charger 104 located on the downstream of the front wheel inverter 102, a rear wheel inverter 105 located on the downstream of the high-voltage charger 104, an oil cooler 106 of a rear wheel motor connected in parallel to the rear wheel inverter 105, and a converter 107 located on the downstream of the rear wheel inverter 105. The converter 107 may be a line commutated converter (LLC).

Referring to FIG. 8, the power electronic cooling system 100 may include a radiator 109 located on the downstream of the converter 107, a three-way valve 108 located between the converter 107 and an inlet of the radiator 109, and a reservoir 110 located on the downstream of the radiator 109. The radiator 109 may be disposed adjacent to a front grille of the vehicle, and a coolant passing through the radiator 109 may be cooled by ambient air.

Figure 9:
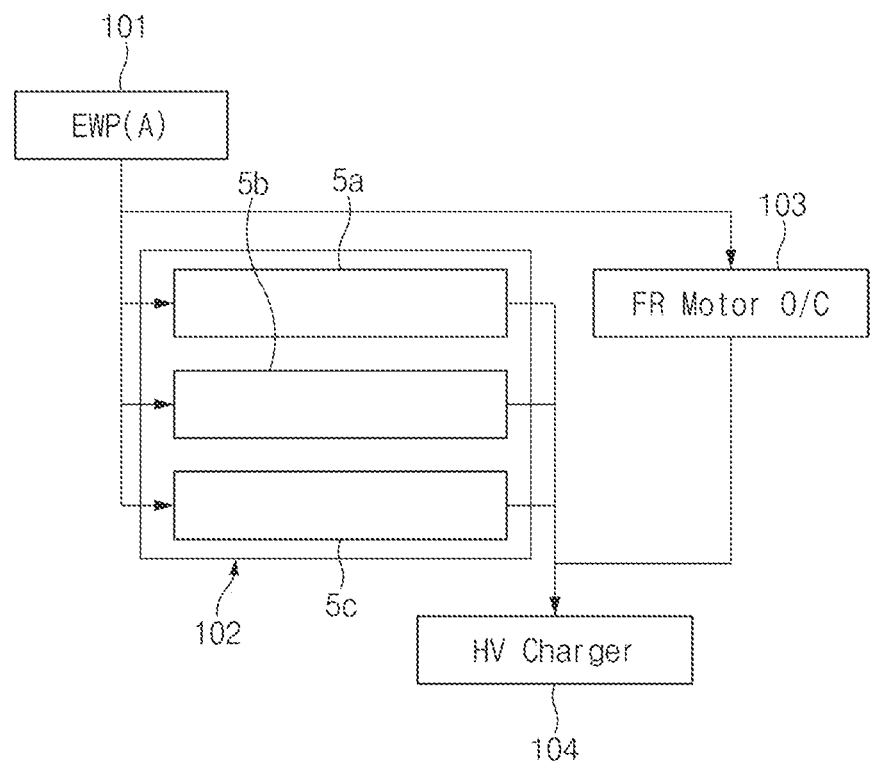
FIG. 9 illustrates a state in which power modules of a front wheel inverter and an oil cooler of a front wheel motor are connected in parallel in a power electronic cooling system.

Referring to FIG. 9, the front wheel inverter 102 may include the plurality of power modules 5a, 5b, and 5c, and the oil cooler 103 of the front wheel motor may be adjacent to the front wheel inverter 102. A cooling fluid line may be connected in parallel to the plurality of power modules 5a, 5b, and 5c and the oil cooler 103 of the front wheel motor. As illustrated in FIGS. 1 to 7, the jet impingement cooling apparatus may be thermally connected to the plurality of power modules 5a, 5b, and 5c. When the cooling fluid circulating through the power electronic cooling system 100 passes through the jet impingement cooling apparatus, the plurality of power modules 5a, 5b, and 5c may be cooled by the jet impingement of the jet impingement cooling apparatus. Resistance to the flow of the cooling fluid may relatively increase due to a small diameter of each orifice 21 of the jet impingement cooling apparatus. However, the cooling fluid may pass in a direction parallel to the plurality of power modules 5a, 5b, and 5c so that the flow resistance of the cooling fluid may be reduced, and a temperature difference between the plurality of power modules 5a, 5b, and 5c may be minimized.

In addition, when the cooling fluid passes in a direction parallel to the jet impingement cooling apparatus connected to the plurality of power modules 5a, 5b, and 5c and the oil cooler 103 of the front wheel motor, the cooling fluid may be appropriately distributed between the jet impingement cooling apparatus and the oil cooler 103 of the front wheel motor. Specifically, due to the relatively small diameter of each orifice 21, the flow rate of the cooling fluid passing through the jet impingement cooling apparatus may be less than the flow rate of the cooling fluid passing through the oil cooler 103 of the front wheel motor. As the cooling fluid is appropriately distributed through the power electronic cooling system 100, the overall flow resistance of the cooling fluid may be minimized.

Figure 10:
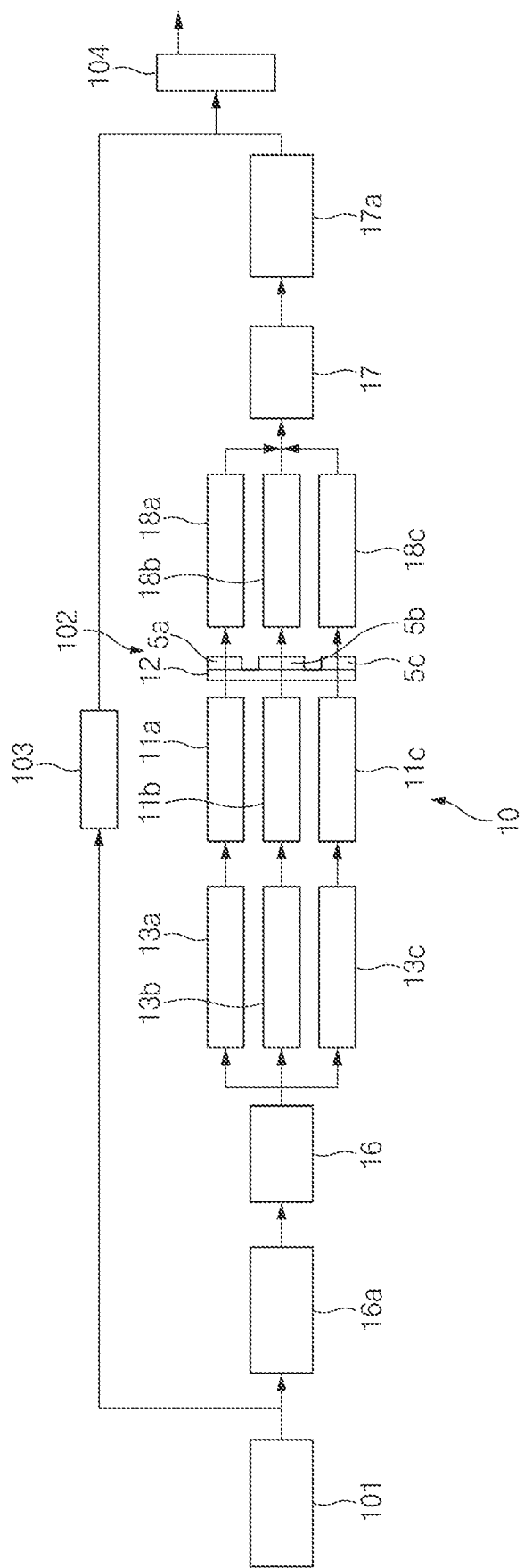
FIG. 10 illustrates a state in which a jet impingement cooling apparatus according to an exemplary embodiment of the present disclosure is connected to power modules of a front wheel inverter.

FIG. 10 illustrates a state in which the jet impingement cooling apparatus 10 according to an exemplary embodiment of the present disclosure is connected to the power modules 5a, 5b, and 5c of the front wheel inverter 102.

Referring to FIG. 10, the inlet pipe 16a may be fluidly connected to the pump 101 of the power electronic cooling system 100, and the outlet pipe 17a may be fluidly connected to a power electronic component (that is, the high-voltage charger 104) located on the downstream of the front wheel inverter 102. Accordingly, the cooling fluid may be supplied to the inlet pipe 16a by the pump 101, and the cooling fluid may be distributed to the plurality of manifolds 13a, 13b, and 13c through the inlet channel 16. The cooling fluid supplied to each of the manifolds 13a, 13b, and 13c may cool the support member 12 and/or the plurality of power modules 5a, 5b, and 5c by the jet stream of the corresponding one of the jet members 11a, 11b, and 11c. Thereafter, the cooling fluid may be directed to the high-voltage charger 104 located on the downstream of the front wheel inverter 102 through the plurality of drain pipes 18a, 18b, and 18c, the outlet channel 17, and the outlet pipe 17a.

According to another exemplary embodiment, the jet impingement cooling apparatus may be mounted on the front wheel inverter 102 and the rear wheel inverter 105 and be configured to cool the power modules of each inverter.

According to an alternative exemplary embodiment, one jet member may extend along the length of the support member 12, and one jet member may cover the plurality of power modules 5a, 5b, and 5c.

According to an alternative exemplary embodiment, one manifold may extend along the length of the support member 12, and one manifold may cover the plurality of power modules 5a, 5b, and 5c. When one manifold covers the plurality of power modules 5a, 5b, and 5c, and the inlet pipe is directly connected to one manifold, the inlet channel 16, the outlet channel 17, and the connection plate 14 may be removed.

According to an alternative exemplary embodiment, a drain passage for draining the cooling fluid may be integrally formed in the support member 12 so that the plurality of drain pipes 18a, 18b, and 18c may be removed.

As set forth above, according to exemplary embodiments of the present disclosure, the plurality of jet streams may be generated as the cooling fluid is ejected from the plurality of orifices, and the plurality of jet streams may directly strike the target having the plurality of recesses so that the target may be primarily cooled. As the cooling fluid flows along the hemispherical surfaces of the recesses, the wall jets may be formed. As adjacent wall jets are merged, the merged stream of relatively high velocity may flow toward the jet member, which may prevent the formation of an additional stagnation region between the adjacent wall jets, and thus the cooling of the target may be maximized.

According to exemplary embodiments of the present disclosure, when the cooling fluid passes through the jet impingement cooling apparatus, the plurality of power modules may be cooled by the jet impingement of the jet impingement cooling apparatus. Resistance to the flow of the cooling fluid may relatively increase due to a small diameter of each orifice of the jet impingement cooling apparatus. However, the cooling fluid may pass in a direction parallel to the plurality of power modules so that the flow resistance of the cooling fluid may be reduced, and a temperature difference between the plurality of power modules may be minimized. Thus, a continuous power output time depending on a temperature of an electric vehicle may increase.

According to exemplary embodiments of the present disclosure, a cooling fluid line may be connected in parallel to the plurality of power modules and another adjacent power electronic component so that the cooling fluid may be properly distributed to the jet impingement cooling apparatus connected to the plurality of power modules and the adjacent power electronic component. Thus, the overall flow resistance of the cooling fluid may be minimized.

According to exemplary embodiments of the present disclosure, as the cooling of the power module is improved by the jet impingement of the cooling fluid, a continuous power output time depending on the temperature of an electric vehicle may increase, and repeated acceleration and maximum power driving time of the electric vehicle may increase.

According to exemplary embodiments of the present disclosure, as the cooling of the power module is improved, power density may increase, and the driving and operation range of the electric vehicle may be improved. By preventing an operating cycle of the power module from being reduced, all electric range (AER) of the electric vehicle may increase.

According to exemplary embodiments of the present disclosure, as the cooling of the power module is improved, cracks may be prevented from occurring in the power module, and delamination may be prevented from occurring between different materials of the power module.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

The invention claimed is:

1. A jet impingement cooling apparatus, comprising:
   a target having a flat surface and a plurality of recesses recessed from the flat surface; and
   a jet member having a plurality of orifices aligned with the plurality of recesses;
   wherein a cooling fluid is ejected from each of the plurality of orifices to each of the plurality of recesses;
   wherein the target is a power module;
   wherein the power module is supported by a support member;
   wherein the support member has an opening which is open to the power module and the jet member;
   wherein the plurality of recesses are recessed from a flat surface of the power module; and wherein the plurality of recesses are exposed to the opening.

2. The jet impingement cooling apparatus according to claim 1, wherein each of the plurality of recesses has a hemispherical shape.

3. The jet impingement cooling apparatus according to claim 1, wherein a central axis of each of the plurality of orifices is aligned with a central axis of a corresponding recess of the plurality of recesses.

4. The jet impingement cooling apparatus according to claim 1, wherein a diameter of each of the plurality of recesses is greater than a diameter of each of the plurality of orifice.

5. A jet impingement cooling apparatus, comprising:
a plurality of power modules;
a support member contacting the plurality of power modules;
a plurality of jet members mounted on the support member; and
a plurality of manifolds mounted on the plurality of jet members;
wherein each of the plurality of jet members has a plurality of orifices spaced apart from the support member;
wherein each of the plurality of manifolds and a corresponding jet member define a distribution chamber in which a cooling fluid is received;
wherein the support member has a plurality of openings which are open to the plurality of power modules; and
wherein each of the plurality of power modules has a plurality of recesses which are aligned with the plurality of orifices.

6. The jet impingement cooling apparatus according to claim 5, further comprising:
an inlet channel fluidly connected to the plurality of manifolds, and having an inlet chamber defined therein; and
an outlet channel fluidly connected to the plurality of jet members, and having an outlet chamber defined therein,
wherein the plurality of manifolds are connected in parallel to the inlet chamber of the inlet channel; and
wherein the plurality of jet members are connected in parallel to the outlet chamber of the outlet channel.

7. The jet impingement cooling apparatus according to claim 6, further comprising a plurality of drain pipes communicating with the plurality of jet members, wherein the plurality of drain pipes are connected in parallel to the outlet chamber of the outlet channel.

8. The jet impingement cooling apparatus according to claim 7, wherein each of the plurality of jet members has a collecting space in which the cooling fluid is collected, and each of the plurality of drain pipes fluidly connects the collecting space of the corresponding jet member and the outlet chamber of the outlet channel.

* * * * *